(12) United States Patent
Akatsu et al.

(10) Patent No.: US 6,329,704 B1
(45) Date of Patent: Dec. 11, 2001

(54) ULTRA-SHALLOW JUNCTION DOPANT LAYER HAVING A PEAK CONCENTRATION WITHIN A DIELECTRIC LAYER

(75) Inventors: Hiroyuki Akatsu, Yorktown Heights; Omer H. Dokumaci, Poughkeepsie; Suryanarayan G. Hegde, New York; Yujun Li, Poughkeepsie, all of NY (US); Rajesh Rengarajan, Dresden (DE); Paul A. Ronsheim, Hopewell Junction, NY (US)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/458,530

(22) Filed: Dec. 9, 1999

(51) Int. Cl.[7] .................... H01L 29/167; H01L 33/00; H01L 29/80; H01L 21/425
(52) U.S. Cl. .................... 257/655; 257/101; 257/269; 438/514
(58) Field of Search .................... 257/101, 269, 257/285, 611, 655, 656, 657; 438/514

(56) References Cited

U.S. PATENT DOCUMENTS

| | | | |
|---|---|---|---|
| 5,401,674 | * 3/1995 | Anjum et al. | 437/190 |
| 5,493,132 | * 2/1996 | Brugge et al. | 257/101 |
| 5,918,140 | * 6/1999 | Wickboldt et al. | 438/535 |
| 6,074,937 | * 6/2000 | Pramanick et al. | 438/528 |
| 6,121,120 | * 9/2000 | Wakabayashi et al. | 438/478 |

OTHER PUBLICATIONS

J. Schmitz et al. "Shallow Junction Fabrication by Rapid Thermal Outdiffusion From Implanted Oxide" *Advances in Rapid Thermal Processing Symposium* 195th meeting of Electrochem Society, Seattle, Washington 1999 (8 pages).

J. Schmitz et al. "Ultra–Shallow Junction Formation by Outdiffusion from Implanted Oxide" 1998 *IEEE–IEDM* (pp. 1009–1012).

* cited by examiner

*Primary Examiner*—Matthew Smith
*Assistant Examiner*—Lex H. Malsawma
(74) *Attorney, Agent, or Firm*—Ratner & Prestia; H. Daniel Schnurmann

(57) ABSTRACT

A process for forming an ultra-shallow junction depth, doped region within a silicon substrate. The process includes forming a dielectric film on the substrate, then implanting an ionic dopant species into the structure. The profile of the implanted species includes a population implanted through the dielectric film and into the silicon substrate, and a peak concentration deliberately confined in the dielectric film in close proximity to the interface between the dielectric film and the silicon substrate. A high-energy, low-dosage implant process is used and produces a structure that is substantially free of dislocation loops and other defect clusters. An annealing process is used to drive the peak concentration closer to the interface, and some of the population of the originally implanted species from the dielectric film into the silicon substrate. A low thermal budget is maintained because of the proximity of the as-implanted peak concentration to the interface and the presence of species implanted through the dielectric film and into the substrate.

7 Claims, 6 Drawing Sheets

ULTRA-SHALLOW JUNCTION DOPANT LAYER HAVING A PEAK CONCENTRATION WITHIN A DIELECTRIC LAYER

FIELD OF THE INVENTION

The present invention relates generally to semiconductor integrated circuit devices. More particularly, the present invention relates to shallow $n^+$ and $p^+$ doped junctions formed within a silicon substrate, and the processes for forming such doped junctions.

BACKGROUND OF THE INVENTION

The formation of ultra-shallow $p^+$ and $n^+$ doped regions within the silicon substrate is a crucial step in the fabrication of metal-oxide semiconductor (MOS) transistors and other semiconductor devices used within integrated circuits. The ever-decreasing size of MOS transistors requires a downscaling of all lateral and vertical dimensions of the transistor. In conventional scaling scenarios, the depth of the junctions, which form the source and drain regions of MOS transistors, scales linearly with gate length. Therefore, shallower junctions of $p^+$ and $n^+$ regions which have suitably low sheet resistance are required in the present semiconductor manufacturing industry.

In conventional semiconductor manufacturing processes, shallow junctions may be formed by ion implantation followed by an anneal such as a rapid thermal anneal (RTA). The reliability of this technique is known in the art down to a junction depth of 300 to 400 angstroms. The task of producing a doped region having both a junction depth of less than 300 or 400 angstroms and a suitably low sheet resistance is more challenging. This task is rendered particularly difficult for p-type shallow doped regions by the implant and diffusion properties of boron, in particular. Crucial issues include control of dopant channeling, reduction of thermal diffusion, and suppression of transient-enhanced diffusion, especially in the case of boron and phosphorus. Moreover, good device performance is only attained with a low sheet resistance of the shallow regions (i.e., with a high impurity concentration). The scaling tendency has been to reduce the ion implant energy while the total dopant level is kept more or less constant, and to reduce the thermal budget without significantly deteriorating the dopant activation level by introducing rapid thermal anneals and spike anneals.

This conventional scaling is expected to become difficult below the 300 to 400 angstrom junction depths, particularly for $p^+$ junctions. The technical difficulty in making a high-current, low-energy ion implantation beam may be alleviated by the use of plasma doping (alternatively called plasma immersion ion implantation). Alternative processes that avoid implantation altogether have also been considered. Examples of such processes include rapid thermal vapor phase doping, gas immersion laser doping, and solid state hot diffusion such as from a BSG (boro-silicate glass), PSG (phosphorus silicon glass), or ASG (arsenic silicon glass) film. All of these processes face one or more problems with manufacturability.

Another process for producing doped regions having shallow junctions includes outdiffusion from an implanted oxide. According to this process, a thin oxide on top of the silicon is implanted with a high dose of boron or phosphorus so as to confine the dopant within the oxide. During a subsequent RTA step, the dopant is driven into the silicon. This process relies on a high concentration of boron or phosphorus in the oxide to provide for sufficient dopant diffusion through the Si—$SiO_2$ interface and into the silicon. Therefore, given the limitations and capabilities of available ion implantation equipment, this process is only practical for use in conjunction with an oxide that is thinner than 100 angstroms. The required high dosage may produce defects within the silicon substrate.

Recent attempts to optimize this process have placed the dopant peak concentration near the top surface of the oxide for fear of creating defects within the silicon, due to high dosage amounts. Such defects may remain within the silicon even after a subsequent annealing process is completed. Recent attempts to use this technique are also limited because nearly all of the implanted species must be implanted into the oxide, and not into the underlying silicon, to avoid the problem of defects. As a consequence, all of the implanted species which diffuse into the silicon during anneal originate from within the oxide film. Because the peak concentration of the implanted species is near the top surface of the oxide film, the annealing process is necessarily a time-consuming process in order to allow for the diffusion of the implanted species from near the upper surface of the oxide film into the silicon. Alternatively, a high dose would be required to achieve a suitably low sheet resistance. Such a high dose is undesirable, however, because defects may result in the silicon substrate.

What is needed is a structure, and a process for producing the structure, that provides a maximum doping of the silicon to produce a suitably low sheet resistance. The process should use a reduced annealing time, a reduced dose, or both a reduced annealing time and a reduced dose with a corresponding reduced implant time. The need is to produce a doped region that has an ultra-shallow junction depth and is substantially defect-free.

SUMMARY OF THE INVENTION

To meet these and other needs, and in view of its purposes, the present invention provides a process and structure that embrace the technique of outdiffusion from an implanted dielectric film. An optimized process is provided in which the peak concentration of the implanted dopant species is closer to the silicon-dielectric interface than as formed by conventional processing attempts. An implant process is provided that uses a higher energy and a lower dose than conventional implant processes targeted at producing the same sheet resistance. The comparatively high energy of the implant process results in the peak concentration being placed closer to the silicon-dielectric interface. The reduced implant dosage and the proximity of the dopant species to the interface prevent the introduction of defects into the silicon, such as dislocation loops and other defect clusters which are not capable of being corrected by a subsequent annealing process.

The process of the present invention produces a structure having a dopant peak concentration in the dielectric and which is closer to the silicon-dielectric interface than the upper surface of the dielectric film. The process includes implanting at least some of the dopant species through the dielectric film and directly into the subjacent silicon. Because some of the implanted species are already in the silicon, and the peak concentration is relatively close to the silicon-dielectric interface, a shorter anneal time is required to drive a significant amount of the implanted dopant species into the silicon and to produce a sufficiently low sheet resistance of the ultra-shallow junction doped region formed within the silicon.

In addition to driving some of the implanted dopant species into the silicon, the anneal process may also move the peak concentration of the implanted species closer to the interface and while using a reduced annealing time. The resulting ultra-shallow junction doped structure includes a high dopant species concentration, a sufficiently low sheet resistance, and virtually no defects because of the proximity of the as-implanted peak concentration to the silicon surface. Such a doped region is particularly useful as a source-drain extension region and finds application in other shallow junction regions which require a shallow junction with a suitably low sheet resistance. The process is manufacturable because of the reduced annealing time and lower dose needed to produce a suitably low sheet resistance.

It is to be understood that both the foregoing general description and the following detailed description are exemplary, but are not restrictive, of the invention.

BRIEF DESCRIPTION OF THE DRAWING

The present invention is best understood from the following detailed description when read in connection with the accompanying drawing. It is emphasized that, according to common practice, the various features of the drawing are not-to-scale. On the contrary, the dimensions of the various features are arbitrarily expanded or reduced for clarity. Included in the drawing are the following figures.

DETAILED DESCRIPTION OF THE INVENTION

The present invention is directed to forming a dopant region within a substrate by deliberately confining the peak concentration of the implanted dopant species within a dielectric (oxide) layer formed over the substrate and very close to the interface formed between the substrate and the dielectric layer. As formed, the dopant region includes an ultra-shallow junction depth which may be less than 300 to 400 angstroms. A low-dose, low-energy implant is used to form the dopant region. Some of the implanted species are implanted through the dielectric layer and directly into the silicon.

A subsequent annealing process is used to cause the diffusion of additional implanted species from the dielectric layer into the substrate. This anneal process may also move the peak concentration of the implanted dopant species closer to the silicon-dielectric interface. A low thermal budget may be maintained because some of the implanted species were directly implanted into the substrate and also because the peak concentration of the implanted species is in close proximity to the interface. This provides a shorter diffusion path for the diffusing species and enables a lower implant dosage to be used. The use of a low-dose implant and the proximity of the as-implanted peak concentration to the silicon-dielectric interface prevent the formation of defect structures which are not removable by subsequent annealing.

Figure 1:
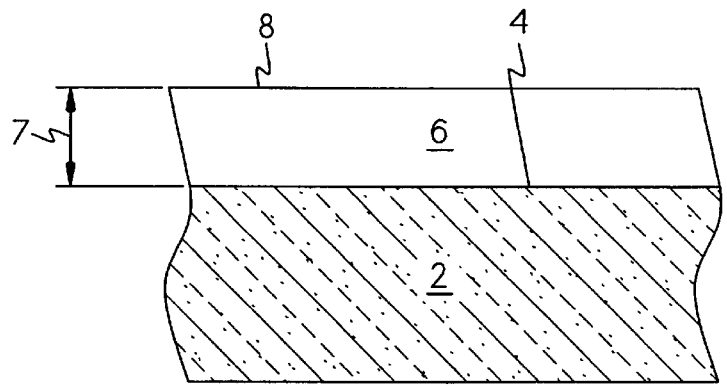
FIG. 1 is a cross-sectional view showing a dielectric film formed over a silicon-substrate.

The details of the present invention can best be understood from the following description when read in conjunction with the drawing. FIG. 1 is a cross-sectional view of a dielectric film 6 formed over the top surface 4 of a substrate 2. In the preferred embodiment, substrate 2 is a silicon substrate, such as a silicon wafer commonly used in the semiconductor manufacturing industry. Dielectric film 6 has an upper surface 8. Dielectric film 6 also has a thickness 7 which may be less than 200 angstroms in an exemplary embodiment, and may lie within the range of 50 to 150 angstroms in the preferred embodiment. Dielectric film 6 may be an oxide film, a nitride film, or other dielectric film formed by suitable conventional mechanisms available in the art. Examples of such methods of formation include thermal oxidation, chemical vapor deposition (CVD) of a silicon nitride film, and CVD of a silicon dioxide film using TEOS (tetraethylorthosilicate) processing techniques.

In an exemplary embodiment, dielectric film 6 may be the surface component of a thermal oxide film formed as a sidewall oxide on a polysilicon gate of a transistor. Dielectric film 6 extends laterally from the gate structure. A source-drain extension region may be formed beneath the lateral extension of dielectric film 6. In the exemplary embodiment as described below, dielectric film 6 is referred to as an oxide film, although it is understood that dielectric film 6 may be a nitride or other material in other exemplary embodiments.

Figure 2:
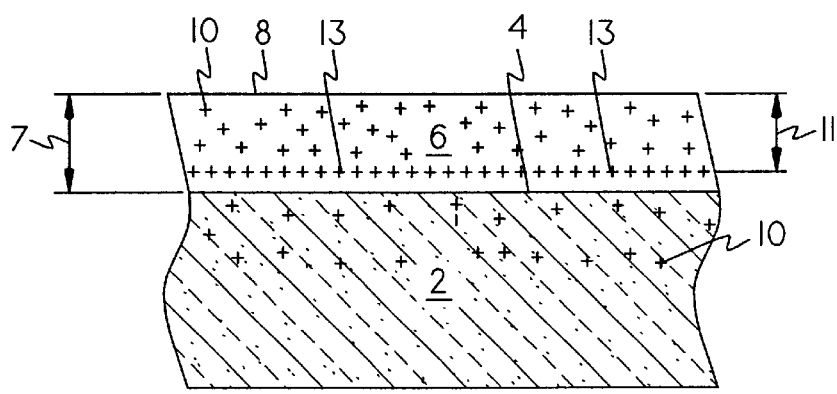
FIG. 2 is a cross-sectional view showing the structure shown in FIG. 1 after being implanted according to the present invention.

FIG. 2 is a cross-sectional view of the structure shown in FIG. 1 after the structure has been implanted according to the process of the present invention. The implanting process may preferably use arsenic, phosphorus, or boron as the ionic dopant species which is implanted. Other species may be implanted alternatively. A sub-5 keV implanter may be used. In the preferred embodiment, an implant energy ranging from 2–10 keV may be used. Also in the preferred embodiment, the implant dose may range from $1 \times 10^{11}$ to $1 \times 10^{16}$ atoms/cm$^2$. The implant process will be chosen to produce a sheet resistance below 3 K$\Omega$/cm$^2$, after a complimentary annealing process is conducted. In an exemplary embodiment, the implanting process may use a 0° tilt and a 0° twist with respect to the surface of the substrate being implanted and the crystalline plane within the substrate, respectively.

FIG. 2 shows that implanted species, designated by "+" signs 10, are present in the oxide film 6 and also in the silicon substrate 2. It should be emphasized that the "+" signs used to indicate the presence of a dopant species are intended to be exemplary only. As such, it should be understood that both p-type and n-type dopant species may be implanted according to the present invention.

FIG. 2 shows that the peak concentration 13 of the implanted species 10 is formed within oxide film 6 and lies closer to the interface formed between oxide film 6 and top surface 4 of substrate 2 than to upper surface 8 of oxide film 6. In an exemplary embodiment for which thickness 7 of oxide film 6 may be 70 angstroms, the depth 11 of peak concentration 13 below upper surface 8 may be on the order of 50 angstroms. It is an advantage of the present invention that peak concentration 13 is disposed relatively closer to top surface 4 of silicon substrate 2 than according to techniques used in the prior art. Because of the low implant dose used, dislocation loops and other cluster defects, which cannot be corrected by subsequent annealing, do not form within the structure being implanted.

Figure 3:
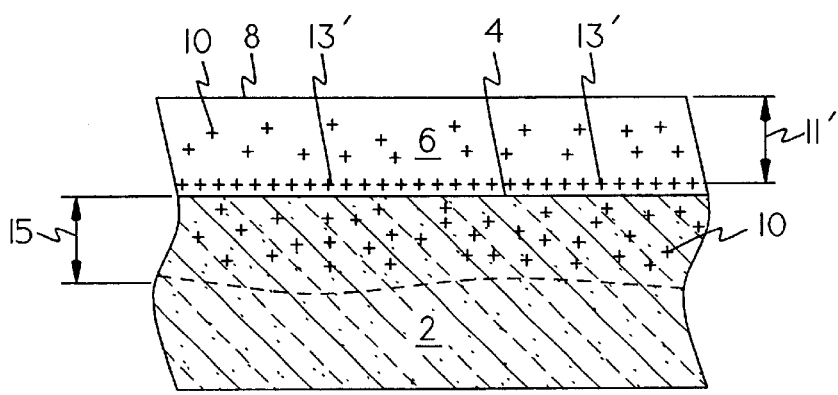
FIG. 3 is a cross-sectional view of the structure shown in FIG. 2 after the structure has been annealed.

FIG. 3 is a cross-sectional view showing the structure shown in FIG. 2 after an anneal process has been used to drive the peak concentration 13 of the implanted species 10 even closer to the interface formed between top surface 4 and oxide film 6. It can be seen that peak concentration 13' is disposed at a depth 11' that is closer to the interface than peak concentration 13 shown in FIG. 2. It can be further seen that the concentration of the implanted species 10 is greater within substrate 2 than shown in FIG. 2. The average junction depth 15 will vary depending on device requirements, but may be less than 300 angstroms in an exemplary embodiment. An aspect of the present invention is that such ultra-shallow junction depths may be produced.

In an exemplary embodiment, the annealing process may comprise a rapid thermal anneal (RTA) carried out for a time ranging from 5 to 15 seconds, and at a temperature within the range of 900 to 1050° C. It should be understood, however, that other times and temperatures may be used and also that a conventional furnace annealing process may be used alternatively. As above, the annealing process is chosen in conjunction with the implant process, so as to produce a sheet resistance below about 3 KΩ/cm², as measured on an exposed surface of the silicon substrate (not shown in FIG. 3). The annealing process also urges the diffusion of at least some of the population of implanted species from oxide film 6 and into substrate 2. In an exemplary embodiment, nitrogen or other ambient gasses may be used during the anneal process.

According to another exemplary embodiment, the anneal process may drive a sufficient concentration of implanted species into substrate 2 to produce a suitably low sheet resistance, as described above, without appreciably driving the peak concentration 13 closer to the interface between top surface 4 and oxide film 6. This phenomena may occur based upon the characteristics of certain implanted species.

Figure 4:
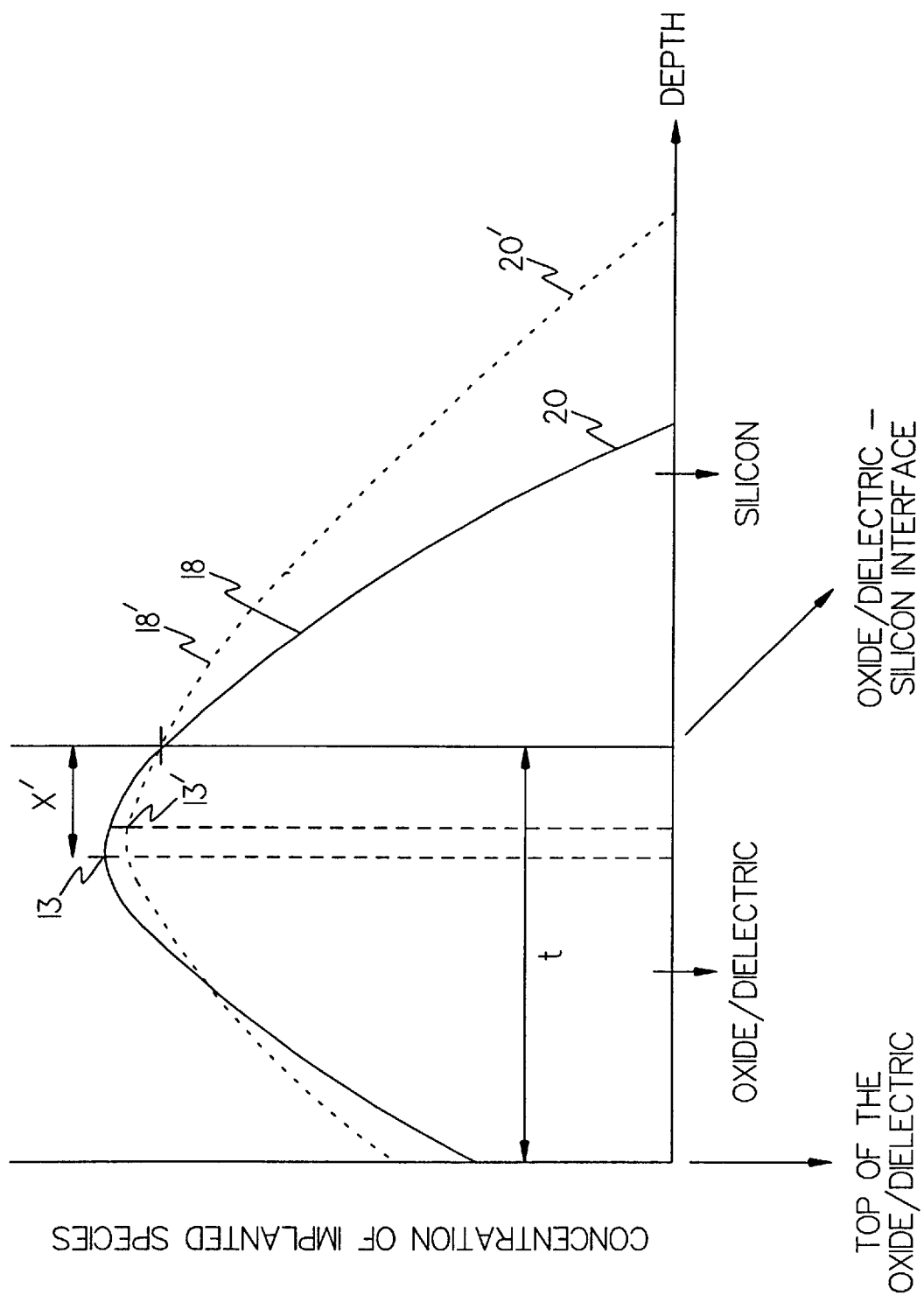
FIG. 4 is a graph showing the concentration profile of the implanted species before and after being annealed.

FIG. 4 is a graph showing the concentration profile of the implanted dopant species shown in FIGS. 2 and 3. Oxide (dielectric) film 6 has a thickness "t." FIG. 4 includes an as-implanted curve 18 which shows the profile of the concentration of the implanted species. As-implanted curve 18 has a tail 20 which indicates species directly implanted into the silicon and through oxide film 6. Peak concentration 13 of the as-implanted concentration profile shown by as-implanted curve 18 is closer to the oxide-silicon interface (a distance X') than it is to the top of oxide film 6 (a distance t—X').

The annealing process, which causes diffusion of the implanted species, results in an adjusted profile of the concentration of the implanted species within the oxide-silicon structure. This adjusted concentration profile is shown by adjusted curve 18'. It can be seen that a greater amount of implanted dopant species is now included in the silicon, and tail 20' of the adjusted concentration profile shown by adjusted curve 18' extends further into the depth of the silicon substrate. Thus, at least some of the implanted species originally in oxide film 6 diffuses over the oxide-silicon interface and into the silicon substrate during the anneal process. It can further be seen that peak concentration 13' of the concentration profile of the implanted species after anneal (adjusted curve 18') is closer to the oxide-silicon interface than was as-implanted peak concentration 13 shown by as-implanted curve 18.

Figure 11:
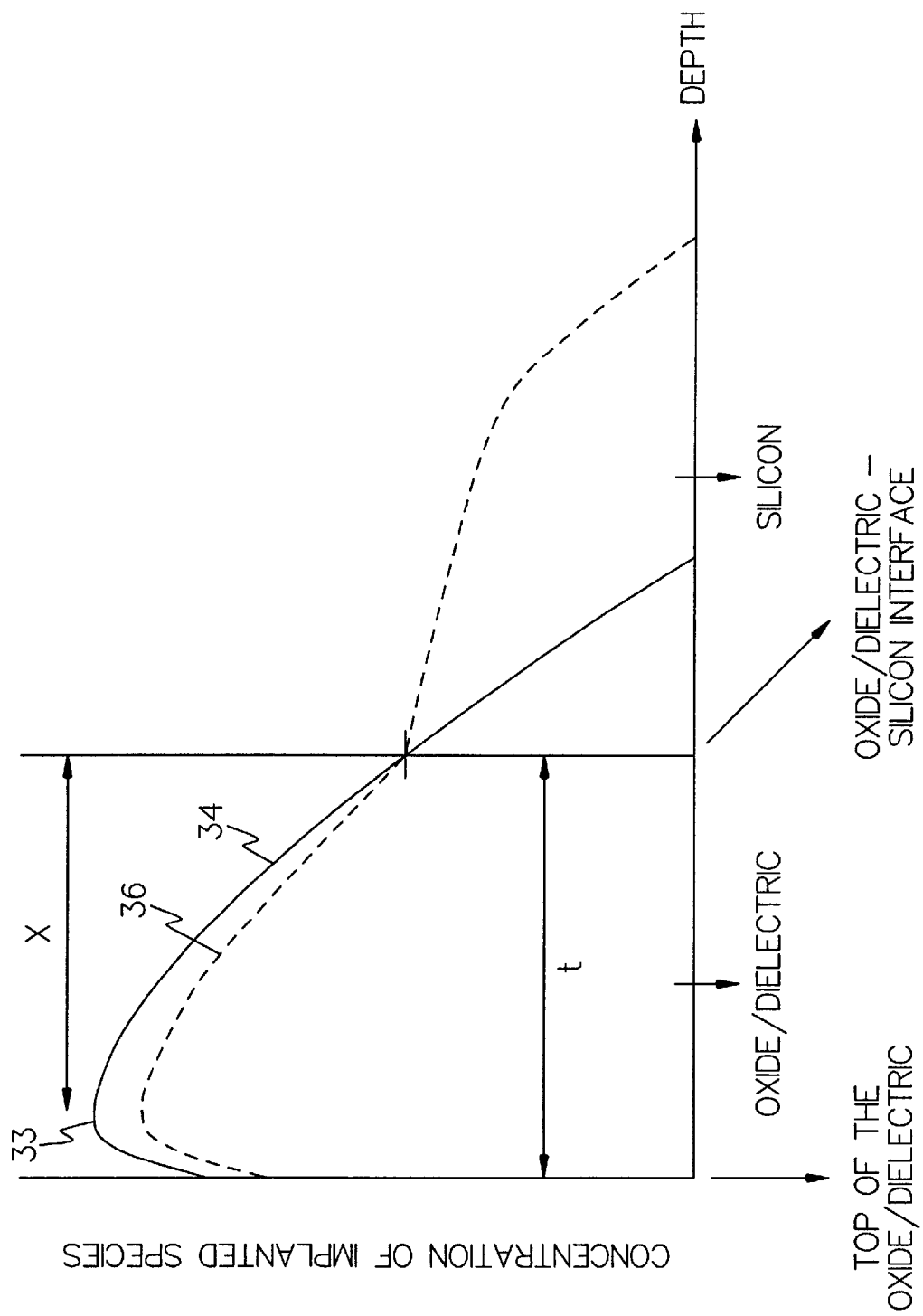
FIG. 11 is a graph showing the concentration profile of an implanted species according to the prior art.

A comparison of the present invention, as shown in FIG. 4, with the structures produced according to the prior art as shown in FIG. 11, reveals the following. Peak concentration 33 of the concentration profile of as-implanted curve 34 as shown in the prior art (FIG. 11) is formed much closer to the top of the dielectric (oxide) film (a distance t—X) and much farther away from the oxide-silicon interface (a distance X) than when the process of the present invention is applied. To achieve the concentration profile of the annealed structure as shown by adjusted curve 36 of FIG. 11, therefore, an annealing process that uses a much higher thermal budget (i.e., longer time, higher temperatures, or both) than is used in the annealing process of the present invention is necessary to produce a dopant concentration within the silicon substrate which results in a suitably low sheet resistance value. Alternatively, a higher dose would have been required to produce an as-implanted concentration profile including a greater concentration of the implanted dopant species within the silicon. Even so, it can be seen by comparison that the dopant concentration achieved by the present invention is greater than that shown by adjusted curve 36 of FIG. 11, resulting in a lowered sheet resistance while maintaining a defect-free, doped silicon region.

Figure 5:
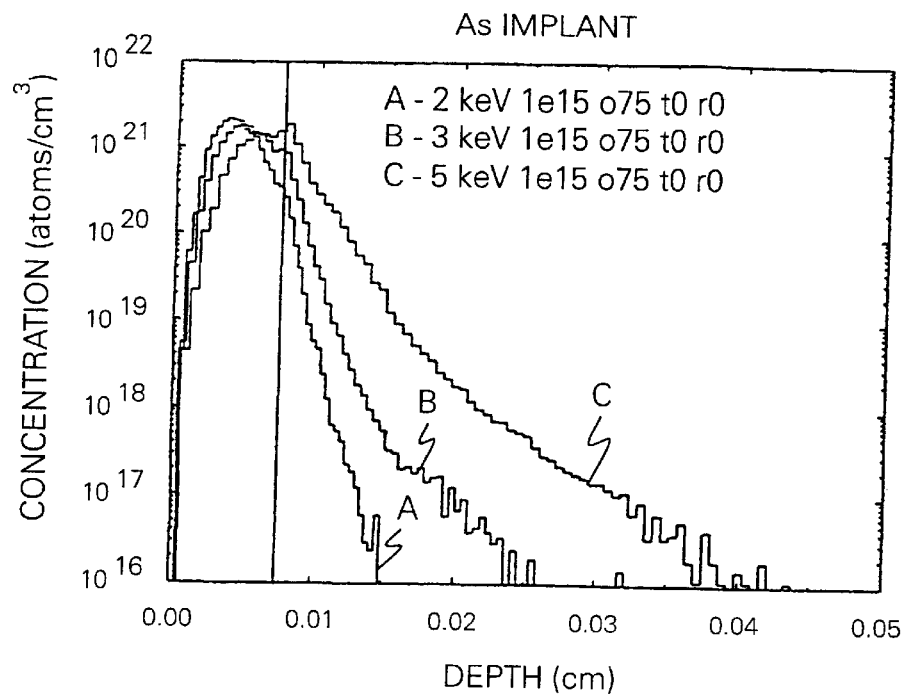
FIGS. 5–8 are graphs showing concentration profiles of various implanted species and using various implanting conditions.
Figure 6:
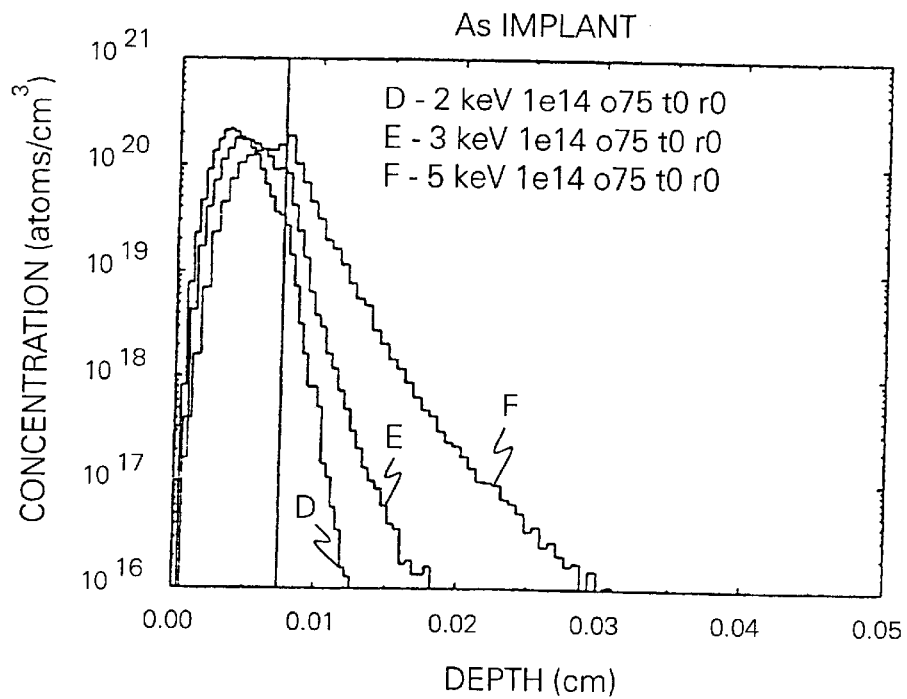
Figure 7:
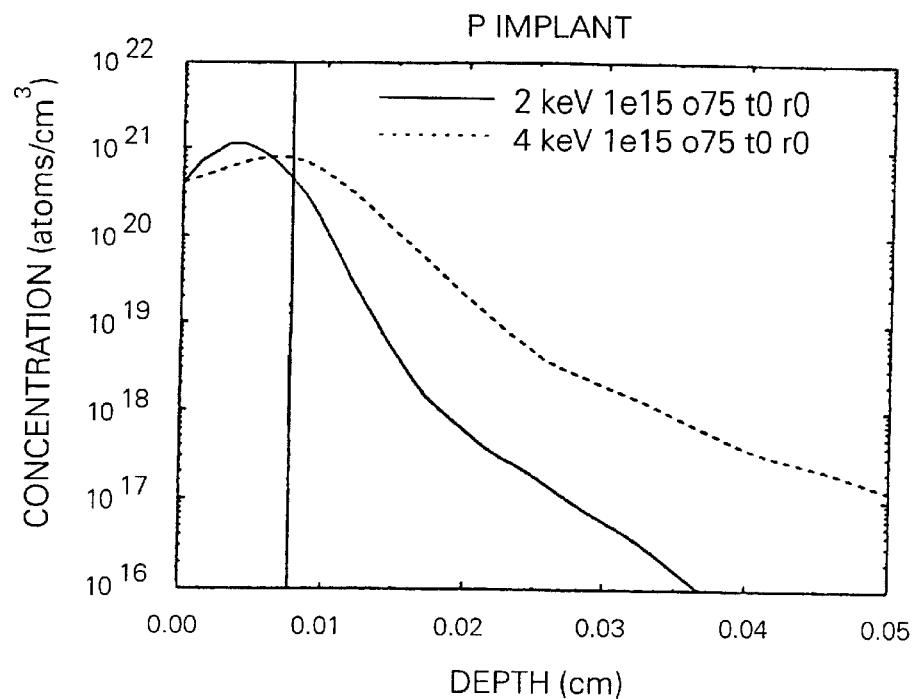
Figure 8:
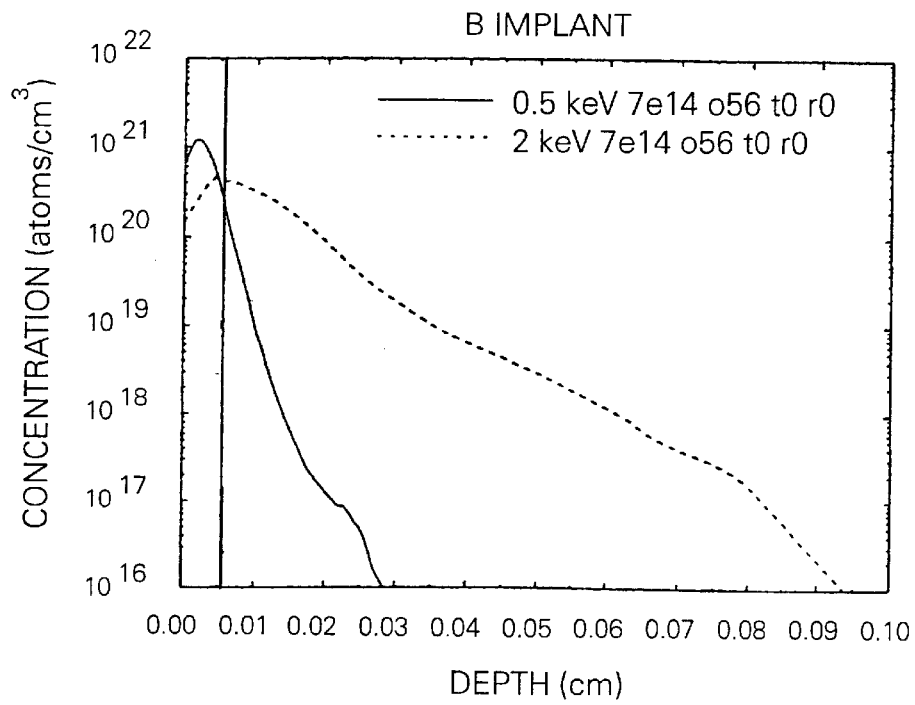

FIGS. 5–8 show various concentration profiles of as-implanted species. FIGS. 5 and 6 show arsenic (As) as the implanted dopant species, FIG. 7 shows phosphorus (P) as the implanted dopant species, and FIG. 8 shows boron (B) as the implanted dopant species. The graphs are intended to be exemplary only. For each graph, the legend appearing on the graph indicates the implant conditions used. For each legend, the following information is provided: implant energy (in keV), implant dose (for example $1 \times 10^{14}$ atoms/cm², written as 1e14), oxide thickness (o, in angstroms); tilt (t, in degrees); and twist (r, in degrees).

Figure 9:
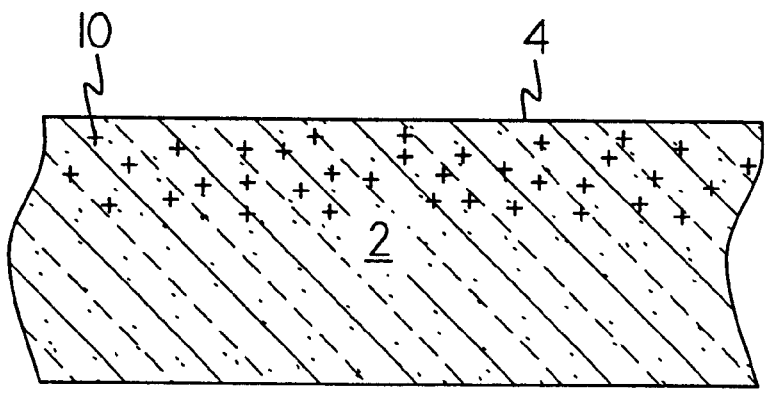
FIG. 9 is a cross-sectional view showing the implanted substrate after the dielectric film has been removed.

In some exemplary embodiments, and for the purposes of measuring the sheet resistance of a test wafer, for example, the oxide film may be removed from the substrate as shown in FIG. 9. Top surface 4 of substrate 2 is now exposed. The sheet resistance as measured on exposed, top surface 4 may lie within the range of about 1 KΩ/cm² to about 3 KΩ/cm² in various exemplary embodiments, but may vary depending on the particular implant and anneal conditions used, as determined by device requirements, in other exemplary embodiments. In the preferred embodiment, the sheet resistance will be less than about 3 KΩ/cm². The measure of sheet resistance is useful in determining implant and anneal conditions for future processing.

Figure 10:
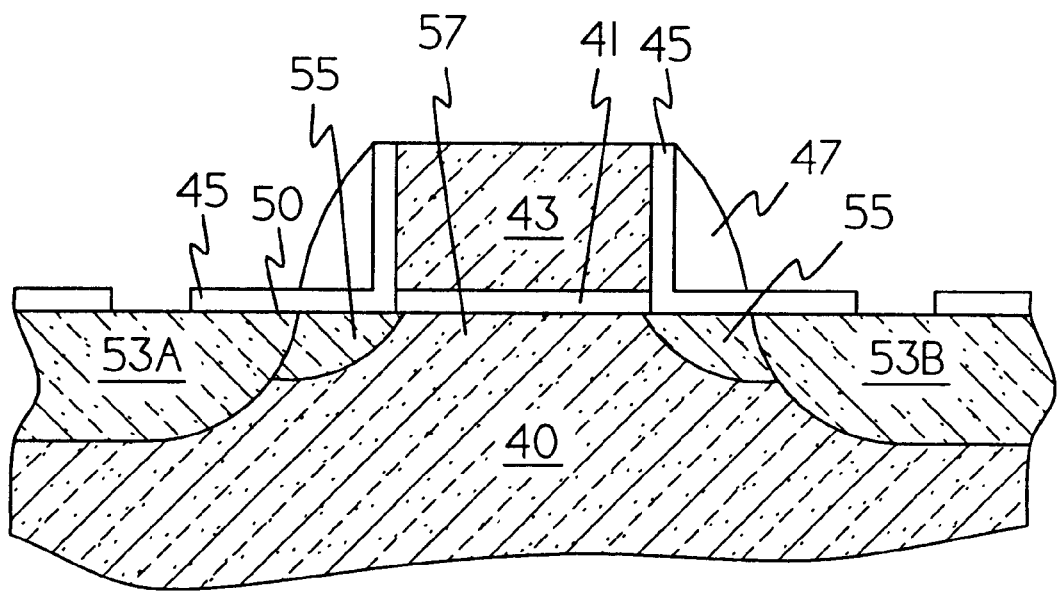
FIG. 10 is a cross-sectional view of a transistor including source-drain extension regions formed according to the present invention.

FIG. 10 is a cross-sectional view showing an exemplary structure within which the ultra-shallow junction doped region of the present invention may be used. FIG. 10 is a cross-sectional view of a transistor which includes gate 43, gate oxide 41, channel region 57, and source/drain regions 53A and 53B formed within substrate 40. The process of the present invention may be used to form source-drain extension regions 55 which are included between channel region 57 and source/drain regions 53A and 53B. Several spacers 47 are provided. It should be understood that source-drain extension regions 55 are formed sequentially before the addition of spacers 47. Therefore, oxide or other dielectric film 45 which forms a sidewall dielectric along gate 43 and includes a lateral component which extends along the surface 50 may constitute the dielectric film through which the source-drain extension regions 55 may be formed according to the present invention.

The structure shown in FIG. 10 is provided for purposes of example only. The ultra-shallow junction doped region formed according to the process of the present invention may be used in various applications where a high-performance, reliable, ultra-shallow doped region is needed. Another advantage of the present invention is that the invention facilitates the manufacturing process. For example, with respect to the transistor structure shown in FIG. 10, a lower thermal budget may be maintained because of the as-implanted concentration profile. A dedicated annealing process to form source-drain extension regions 55 according to the process of the present invention may not be needed because the diffusion of the implanted species, as described in conjunction with FIG. 3, may occur during a subsequent high-temperature process operation as may be carried out later in the processing sequence. An example of such a high-temperature process may be the activation anneal typically conducted after the formation of source/drain regions 53A and 53B. Another advantage of the present invention is the lower implant dose required. This prevents the formation of defect clusters which cannot be corrected during the annealing operations.

The foregoing description of exemplary embodiments of the invention has been presented for the purposes of illustrating and describing the main points of the concepts of the invention. The present invention is not limited, however, to those embodiments. For example, other ionic species may be implanted according to the process of the present invention. Likewise, the shallow junction doped regions formed according to the process of the present invention may be used for various other applications. For example, the shallow junction doped regions which are formed may be used to form source/drain regions 53A and 53B as shown in FIG. 10.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A semiconductor device comprising:
    a silicon substrate having a top surface;
    a dielectric film formed over the top surface of the silicon substrate, the dielectric film having an upper surface and a lower surface creating an interface with the top surface of said silicon substrate; and
    a population of dopant species having a sufficiently low concentration that defects which cannot be corrected by annealing are avoided and having an annealed peak concentration within said dielectric film and closer to said interface than said upper surface, wherein at least some of said population of said dopant species is disposed within said silicon substrate.

2. The semiconductor device as in claim 1, wherein said dielectric film has a thickness of less than 200 Angstroms.

3. The semiconductor device as in claim 1, wherein said dielectric film comprises a thermally grown silicon dioxide film.

4. The semiconductor device as in claim 1, wherein said dopant species comprises arsenic.

5. The semiconductor device as in claim 1, wherein said dopant species comprises one of boron and phosphorus.

6. The semiconductor device as in claim 1, wherein said dielectric film comprises a silicon nitride film.

7. A source-drain extension region of a transistor device formed within a silicon substrate having a top surface, said source/drain extension region comprising:
    a dielectric film formed over the top surface of the silicon substrate, the dielectric film having an upper surface and a lower surface creating an interface with the top surface of said silicon substrate; and
    a population of dopant species having a sufficiently low concentration that defects which cannot be corrected by annealing are avoided and having an annealed peak concentration within said dielectric film and closer to said interface than said upper surface, wherein at least some of said population of said dopant species is disposed within said silicon substrate.

* * * * *